(12) United States Patent
Pappert

(10) Patent No.: US 6,380,760 B1
(45) Date of Patent: Apr. 30, 2002

(54) INTEGRATED CIRCUIT FOR HANDLING BUFFER CONTENTION AND METHOD THEREOF

(75) Inventor: Bernard J. Pappert, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/636,493

(22) Filed: Aug. 11, 2000

Related U.S. Application Data

(63) Continuation of application No. 09/114,119, filed on Jul. 13, 1998.

(51) Int. Cl.[7] .......................................... H03K 19/0185
(52) U.S. Cl. ............................................. 326/56; 83/86
(58) Field of Search ............................... 326/83, 86, 80, 326/81, 82, 56–58

(56) References Cited

U.S. PATENT DOCUMENTS

| | | | | |
|---|---|---|---|---|
| 5,576,635 A | * | 11/1996 | Partovi et al. ................. | 326/83 |
| 5,764,077 A | * | 6/1998 | Andresen et al. .............. | 326/83 |
| 5,767,701 A | | 6/1998 | Choy et al. .................... | 326/93 |
| 5,850,159 A | * | 12/1998 | Chow et al. ................... | 326/83 |
| 5,880,603 A | | 3/1999 | Shigehara et al. ............. | 326/81 |
| 6,020,757 A | | 2/2000 | Jenkins, IV ................... | 326/39 |
| 6,147,510 A | * | 11/2000 | Pappert ......................... | 326/83 |

* cited by examiner

*Primary Examiner*—Michael Tokar
*Assistant Examiner*—Don Phu Le
(74) *Attorney, Agent, or Firm*—Susan C. Hill; Kent J. Cooper

(57) ABSTRACT

In one embodiment, an integrated circuit (10, 110) has a contention detection circuit (12, 112) coupled to a tri-stateable output buffer (18, 118). The contention detection circuit (12, 112) provides a contention tri-state control signal (34, 134) to the tri-stateable output buffer (18, 118) in order to place it in a tri-stated condition when an external device (31, 131), such as a computer, supplies power to an input/output pad (22, 122) on the integrated circuit (10, 110). Thus, external and/or internal buffer contention is avoided when an external device (31, 131), such as a computer, supplies power to an input/output pad (22, 122) on the integrated circuit (10, 110).

3 Claims, 3 Drawing Sheets

US 6,380,760 B1

INTEGRATED CIRCUIT FOR HANDLING BUFFER CONTENTION AND METHOD THEREOF

RELATED APPLICATIONS

This application is a continuation of Ser. No. 9/114,119 filed Jul. 13, 1998.

This application is related to U.S. patent application Ser. No. 08/942,740, filed on Oct. 2, 1997, and assigned to the current assignee hereof.

FIELD OF THE INVENTION

The present invention relates in general to integrated circuits, and more particularly to a method and apparatus for handling integrated circuit buffer contention.

BACKGROUND OF THE INVENTION

During operation, a computer may be connected to another device such as a printer that contains a semiconductor device, such as an application specific integrated circuit (ASIC). At times, the printer may be turned off while the computer is still on. Under these conditions, the semiconductor device within the printer is powered down. If the computer drives a high level to the printer while it is powered down, an input/output buffer on the semiconductor device may be powered up by the computer. However, since the internal circuitry of the semiconductor device is powered down, this can cause external or off chip buffer contentions. The off chip contentions occur because the semiconductor device does not have a clock signal to clear out contentions that occur when the input/output pad is powered up and the core of the semiconductor device is powered down. In addition, internal or on chip buffer contentions can occur if an external source powers up an input/output buffer on a powered up semiconductor device that is supplying power to other input/output buffers on the semiconductor device. Internal and external buffer contentions can cause significant discharge current that can drain the battery on a laptop computer or similar device. Accordingly, a need exists for an integrated circuit that handles external as well as internal buffer contentions, and that is suitable for low power applications.

DETAILED DESCRIPTION OF THE DRAWINGS

Figure 1:
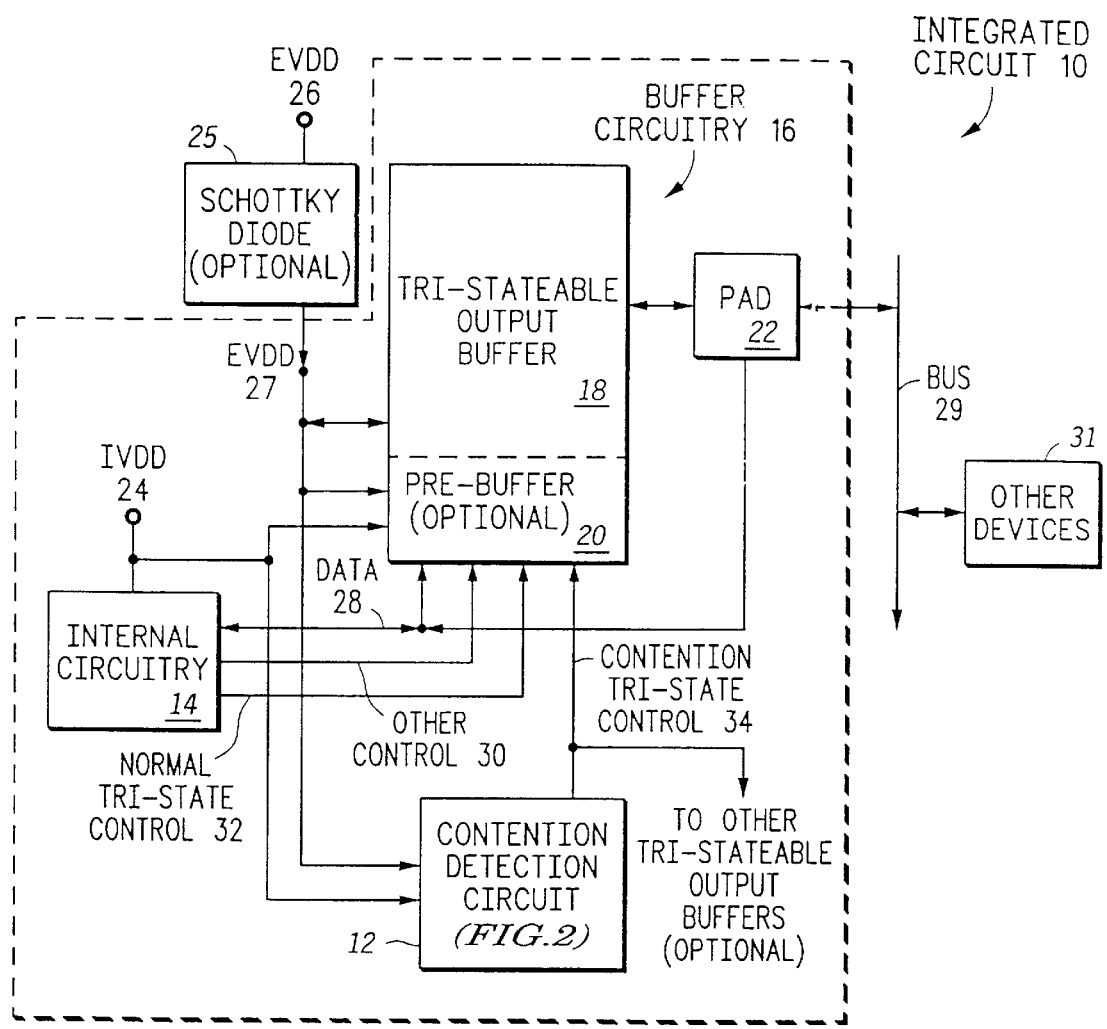
FIG. 1 illustrates, in block diagram form, integrated circuit 10 in accordance with one embodiment of the present invention.

Shown in FIG. 1 is a portion of an integrated circuit 10 for handling buffer contention in accordance with one embodiment of the present invention. Integrated circuit 10 comprises a contention detection circuit 12, internal circuitry 14, a terminal or input/output pad 22, and buffer circuitry 16. In one embodiment of the invention, buffer circuitry 16 provides an output signal to input/output pad 22 and comprises a tri-stateable output buffer 18, and a pre-buffer 20 as shown in FIG. 1. It should be noted that a tri-stateable output buffer as used herein, refers to a buffer which is capable of being placed into a high impedance state. In addition, when the output of a tri-stateable buffer is in a high impedance state the buffer is said to be in a "tri-stated" or a "tri-state" condition.

Contention detection circuit 12, tri-stateable output buffer 18, and pre-buffer 20 are coupled to a non-ground power supply terminal having an external power supply voltage signal (EVDD) 27. Internal circuitry 14, pre-buffer 20, and contention detection circuit 12 are coupled to a non-ground power supply terminal having an internal power supply voltage signal (IVDD) 24. Data bus 28 is coupled to pre-buffer 20, input/output pad 22, and internal circuitry 14. Normal tri-state control signal 32 is coupled to pre-buffer 20 and internal circuitry 14. Other control signal 30 is coupled to pre-buffer 20 and internal circuitry 14. Contention tri-state control signal 34 is coupled to contention detection circuit 12 and pre-buffer 20. It should be appreciated that contention tri-state control signal 34 may also be coupled to other tri-stateable output buffers as shown in FIG. 1. Tri-stateable output buffer 18 is coupled to input/output pad 22. Integrated circuit 10 is coupled to a data bus 29 which is in turn coupled to other device(s) 31. For example, in one embodiment other device(s) 31 is a computer and input/output pad 22 is coupled to the computer via bus 29. In addition in one embodiment, integrated circuit 10 is coupled to a schottky diode 25. The schottky diode 25 is coupled to EVDD 27 and receives external power supply voltage signal (EVDD) 26 as an input.

In this particular embodiment of the invention, EVDD 27 and IVDD 24 have substantially the same supply voltage during normal operation. For example, EVDD 26 and IVDD 24 are both approximately 5 volts or EVDD 26 and IVDD 24 are both approximately 3.3 volts. During normal operation, EVDD 26 is powered up (e.g. at approximately 5 volts), IVDD 24 is powered up (e.g. at approximately 5 volts), and thus EVDD 27 is generated in response to EVDD 26. In this case, contention detection circuit 12 provides a contention tri-state control signal 34 which is non-active, and thus contention detection circuit 12 does not effect the output of tri-stateable output buffer 18. In addition, under these conditions internal circuitry 14 supplies a normal tri-state control signal 32 to pre-buffer circuit 20.

However, when EVDD 26 is powered down (e.g. at approximately 0 volts), and IVDD 24 is powered down (e.g. at approximately 0 volts), EVDD 27 may be generated in response to other device(s) 31, and thus a potential buffer contention condition may exist within integrated circuit 10. More specifically other device(s) 31, which is coupled to input/output pad 22, may supply power to input/output pad 22 through bus 29, and thus generate EVDD 27 within integrated circuit 10 when EVDD 26 and IVDD 24 are powered down. For example, if EVDD 26 and IVDD 24 are powered down and other device(s) 31 drives input/output pad 22 to 5 volts, then EVDD 27 is pulled up to approximately the same voltage (i.e. approximately 5 volts) as input/output pad 22. This occurs because tri-stateable output buffer 18 contains an output PMOS pull up transistor and when other device(s) 31 drives input/output pad 22 to 5 volts, the diode formed between the P+ drain and the N-well body of the output PMOS pull up transistor charges the N-well body to a voltage that is a diode drop below the voltage being driven to input/output pad 22. If the gate potential of the output PMOS pull up transistor is low (e.g. approximately 0 volts) and the output PMOS pull up transistor is turned on, then EVDD 27 is pulled up to approximately the same voltage that is being driven to input/output pad 22 because the N-well body of the output PMOS pull up transistor is coupled to EVDD 27. Under these conditions, contention detection circuit 12 is powered to EVDD 27 by tri-state output buffer 18, and if EVDD 27 is greater than IVDD 24, contention detection circuit 12 supplies a contention tri-state control signal 34 which is active and tri-stateable output buffer 18 is forced to a tri-stated condition. Thus, it should be appreciated that tri-stateable output buffer 18 is tri-stated when contention detection circuit 12 detects a predetermined voltage differential between EVDD 27 and IVDD 24. It is also important to note that schottky diode 25 prevents EVDD 26 from being powered up by EVDD 27 when EVDD 26 and IVDD 24 are powered down, and input/output pad 22 is being powered up by other device(s) 31.

Figure 2:
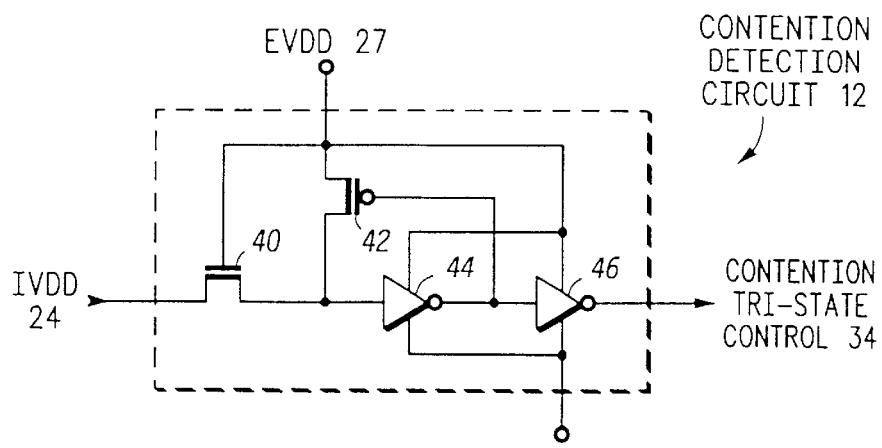
FIG. 2 illustrates, in schematic diagram form, a contention detection circuit 12 of FIG. 1 in accordance with one embodiment of the present invention.

Shown in FIG. 2 is a schematic diagram of the contention detection circuit 12 of FIG. 1 in accordance with one embodiment of the present invention. Contention detection circuit 12 receives IVDD 24 at a first power supply terminal and EVDD 27 at a second power supply terminal, and outputs contention tri-state control signal 34 at an output terminal, wherein contention tri-state control signal 34 has either a logic high value or a logic low value. More specifically, contention detection circuit 12 comprises an NMOS transistor 40, a PMOS transistor 42, an inverter 44, and an inverter 46. A first current electrode of NMOS transistor 40 is coupled to IVDD 24, and a second current electrode of NMOS transistor 40 is coupled to the input of inverter 44 and a first current electrode of PMOS transistor 42. EVDD 27 is coupled to the control electrode of NMOS transistor 40, a second current electrode of PMOS transistor 42, inverter 46, and inverter 44. The control electrode of PMOS transistor 42 is coupled to the output of inverter 44 and the input of inverter 46. A power supply terminal having an external power supply voltage signal (EVSS) 47 is coupled to inverter 44 and inverter 46. In one embodiment, EVSS 47 is a ground potential. The output of inverter 46 is coupled to pre-buffer 20 as shown in FIG. 1.

If EVDD 27 and IVDD 24 are powered up, the output of contention detection circuit 12 is high and the contention tri-state control signal 34 is inactive or disabled. Thus, the tri-stateable output buffer 18 is not forced into a tri-state condition when the contention tri-state control signal 34 is high. However, if EVDD 27 is generated in response to input/output pad 22 being powered up by other device(s) 31 and IVDD 24 and EVDD 26 are powered down, then the output of contention detection circuit 12 is low and the contention tri-state control signal 34 is active or enabled. Thus, the tri-stateable output buffer 18 is forced into a tri-state condition when the contention tri-state control signal 34 is low.

More specifically, when EVDD 27 is powered up, NMOS transistor 40 is turned on and inverters 44 and 46 are powered up. If IVDD 24 is powered down, then the input to NMOS transistor 40 is low, PMOS transistor 42 is turned off, and the output of inverter 46 is low.

However, if EVDD 27 is powered up and IVDD is powered up, the input of NMOS transistor 40 is high, PMOS transistor 42 is turned on, and the output of inverter 46 is high. It should be appreciated that under these conditions there is no DC current flow between IVDD 24 and EVDD 27, and between IVDD 24 and EVSS 47. In addition, there is no DC current flow between EVDD 27 and EVSS 47. Therefore, integrated circuits fabricated with contention detection circuit 12 can be used in products that require low power consumption or IDDQ measurements for improved quality and reliability.

Figure 3:
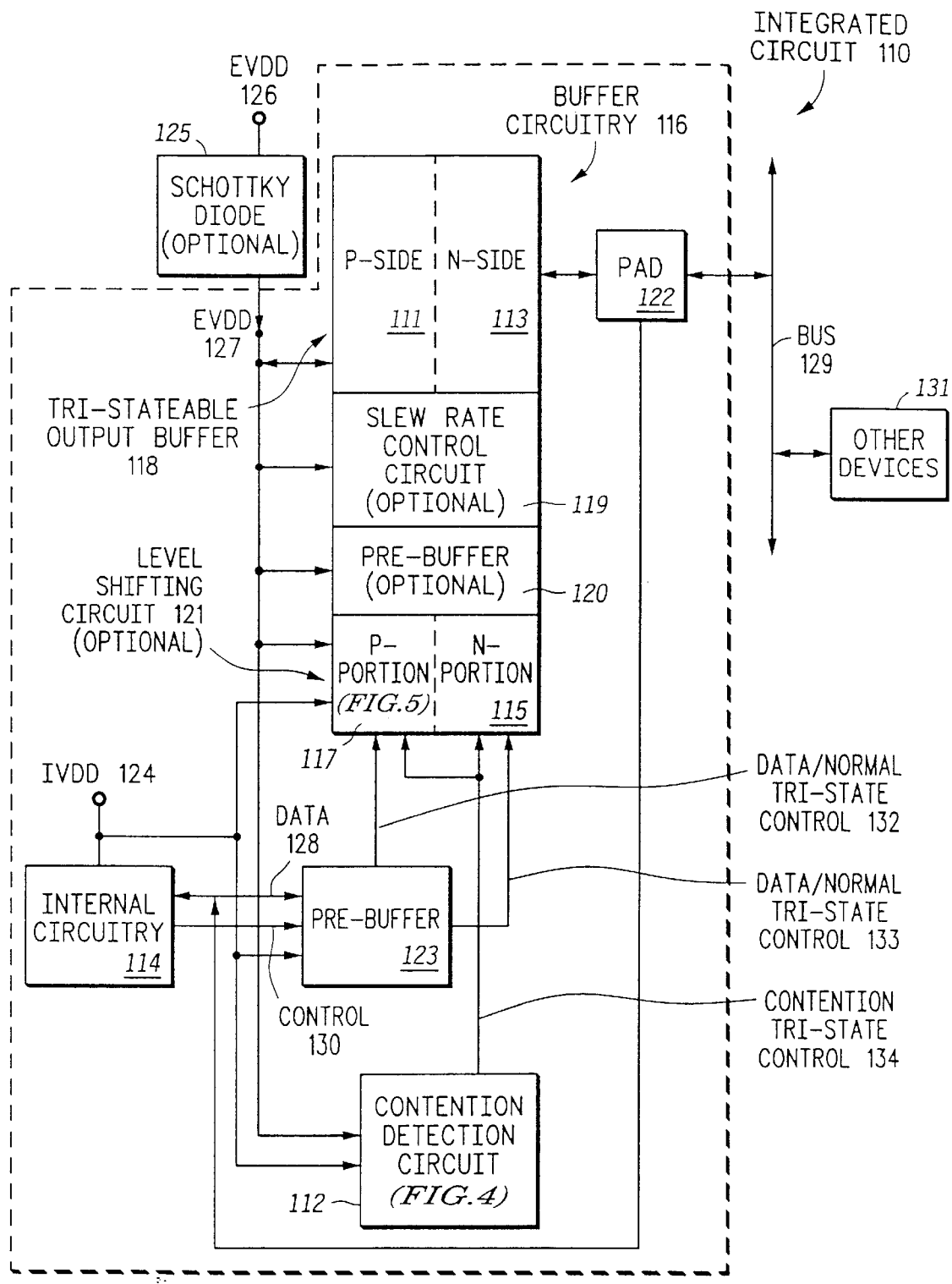
FIG. 3 illustrates, in block diagram form, integrated circuit 110 in accordance with an alternate embodiment of the present invention.

Shown in FIG. 3 is a portion of an integrated circuit 110 for handling buffer contention in accordance with an alternative embodiment of the present invention. Integrated circuit 110 comprises a contention detection circuit 112, internal circuitry 114, a terminal or input/output pad 122, buffer circuitry 116, and a pre-buffer circuit 123. In one embodiment of the invention, buffer circuitry 116 provides an output signal to input/output pad 122 and comprises a tri-stateable output buffer 118, a slew rate control circuit 119, a pre-buffer circuit 120, and a level shifting circuit 121. As shown in FIG. 3, level shifting circuit 121 comprises an N-portion 115 and a P-portion 117 and tri-stateable output buffer 118 has an N-side 113 and a P-side 111.

Contention detection circuit 112, tri-stateable output buffer 118, slew rate control circuit 119, pre-buffer circuit 120, and level shifting circuit 121 are coupled to a non-ground power supply terminal having an external power supply voltage signal (EVDD) 127. Internal circuitry 114, pre-buffer circuit 123, level shifting circuit 121, and contention detection circuit 112 are coupled to a non-ground power supply terminal having an internal power supply voltage signal (IVDD) 124. Data bus 128 is coupled to pre-buffer circuit 123, input/output pad 122, and internal circuitry 114. Data/normal tri-state control signal 132 is coupled to pre-buffer circuit 123, N-portion 115, and P-portion 117. Contention tri-state control signal 134 is coupled to contention detection circuit 112, P-portion 117, and N-portion 115. Tri-stateable output buffer 118 is coupled to input/output pad 122. Integrated circuit 110 is coupled to a data bus 129 which is in turn coupled to other device(s) 131. For example, in one embodiment other device(s) 131 is a computer and input/output pad 122 is coupled to the computer via bus 129. In addition in one embodiment, integrated circuit 110 is coupled to a schottky diode 125. The schottky diode 125 is coupled to external power supply voltage signal (EVDD) 127 and receives external power supply voltage signal (EVDD) 126 as an input.

In this particular embodiment of the invention integrated circuit 110 is a mixed voltage circuit. For example, EVDD 126 may be approximately 5 volts and IVDD 124 may be approximately 3.3 volts. It should be appreciated that if integrated circuit 110 is a mixed voltage circuit, then during normal operation level shifting circuit 121 may be required to level shift lower voltage internal data signals and control signals (e.g. 3.3 volt signals) to higher voltages (e.g. 5 volts) for buffer circuitry 116. For example, P-portion 117 of level shifting circuit 121 may receive a 3.3 volt data/normal tri-state control signal 132 as an input signal, and then shift this input signal to form a 5.0 volt level-shifted signal. This 5.0 volt level shifted signal is then used to control P-side 111 of tri-stateable output buffer 118, and thus control the output of tri-stateable output buffer 118 to input/output pad 122.

During normal operation EVDD 126 is powered up (e.g. at approximately 5 volts) and IVDD 124 is powered up (e.g., at approximately 3.3 volts), and thus EVDD 127 is generated in response to EVDD 126. In this case, contention detection circuit 112 provides a contention tri-state control signal 134 which is non-active, and thus contention detection circuit 112 does not effect the output of tri-stateable output buffer 118. In addition, under these conditions pre-buffer circuit 123 supplies a data/normal tri-state control signal 132 to P-portion 117 and a data/normal tri-state control signal 133 to N-portion 115.

However, when EVDD 126 is powered down (e.g. at approximately 0 volts), and IVDD 124 is powered down (e.g. at approximately 0 volts), EVDD 127 may be generated in response to other device(s) 131, and thus a potential buffer contention condition may exist within integrated circuit 110. More specifically other device(s) 131, which is coupled to input/output pad 122, may supply power to input/output pad 122 through bus 129, and thus generate EVDD 127 within integrated circuit 110 when EVDD 126 and IVDD 124 are powered down. For example, if EVDD 126 and IVDD 124 are powered down and other device(s) 131 drives input/output pad 122 to 5 volts, then EVDD 127 is pulled up to approximately the same voltage (i.e. approximately 5 volts) as input/output pad 122. This occurs because P-side 111 contains an output PMOS pull up transistor and when other device(s) 131 drives input/output pad 122 to 5 volts, the diode formed between the P+ drain and the N-well body of the output PMOS pull up transistor charges the N-well body to a voltage that is a diode drop below the voltage being driven to input/output pad 122. If the gate potential of the output PMOS pull up transistor is low (e.g. approximately 0 volts) and the output PMOS pull up transistor is turned on, then EVDD 127 is pulled up to approximately the same voltage as that is being driven to input/output pad 122 because the N-well body of the output PMOS pull up transistor is coupled to EVDD 127. Under these conditions, contention detection circuit 112 is powered to EVDD 127 by tri-state output buffer 118, and if EVDD 127 is greater than IVDD 124, contention detection circuit 112 supplies a contention tri-state control signal 134 which is active and tri-stateable output buffer 118 is forced to a tri-stated condition. Thus, it should be appreciated that tri-stateable output buffer 118 is tri-stated when contention detection circuit 112 detects a predetermined voltage differential between EVDD 127 and IVDD 124. It is also important to note that schottky diode 125 prevents EVDD 126 from being powered up by EVDD 127 when EVDD 126 and IVDD 124 are powered down, and input/output pad 122 is being powered up by other device(s) 131.

Figure 4:
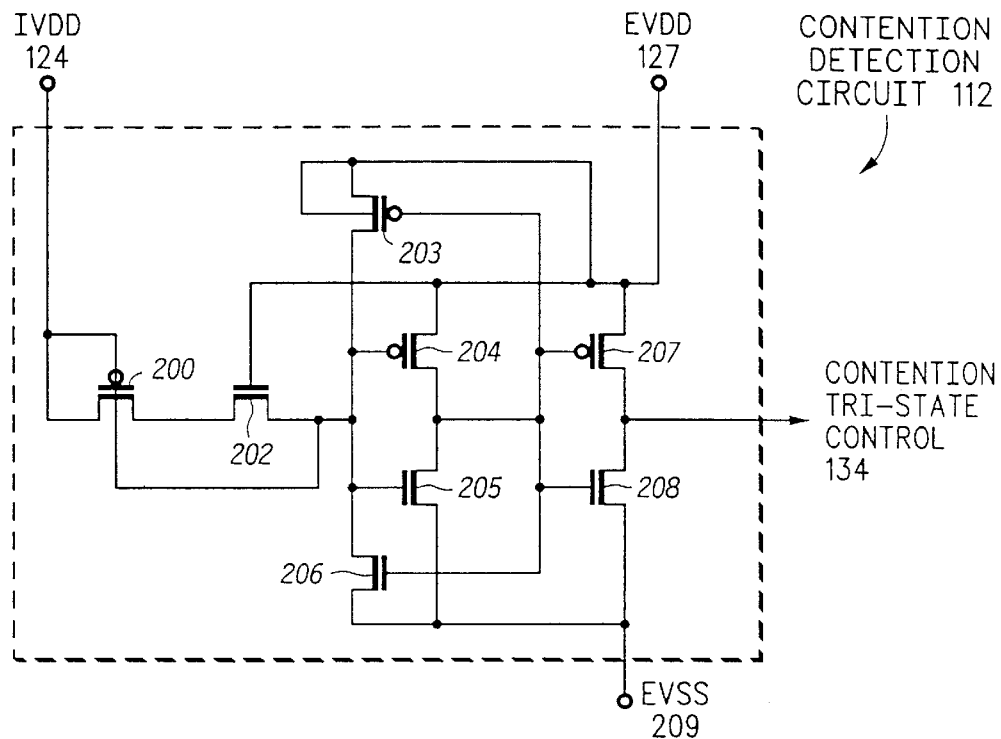
FIG. 4 illustrates, in schematic diagram form, a contention detection circuit 112 of FIG. 3 in accordance with an alternate embodiment of the present invention.

Shown in FIG. 4 is a schematic diagram of the contention detection circuit 112 of FIG. 3 in accordance with one embodiment of the present invention. Contention detection circuit 112 receives IVDD 124 at a first power supply terminal and EVDD 127 at a second power supply terminal, and outputs contention tri-state control signal 134 at an output terminal, wherein contention tri-state control signal 134 has either a logic high value or a logic low value. More specifically, contention detection circuit 112 comprises a PMOS transistor 200, an NMOS transistor 202, a PMOS transistor 203, a PMOS transistor 204, an NMOS transistor 205, an NMOS transistor 206, a PMOS transistor 207, an NMOS transistor 208.

The control electrode of PMOS transistor 200 and a first current electrode of first PMOS transistor 200 are coupled to IVDD 124. The second current electrode of PMOS transistor 200 is coupled to a first current electrode of NMOS transistor 202. The second current electrode of NMOS transistor 202 is coupled to the well region of PMOS transistor 200. EVDD 127 is coupled to the control electrode of NMOS transistor 202, a first current electrode of PMOS transistor 204, a first current electrode of PMOS transistor 207, a first current electrode of PMOS transistor 203, and to the well region of PMOS transistor 203. The second current electrode of PMOS transistor 203 is coupled to the control electrode of PMOS transistor 204, the control electrode of NMOS transistor 205 and a first current electrode of NMOS transistor 206, and the second current electrode of NMOS transistor 202. The control electrode of PMOS transistor 203 is coupled to the control electrode of PMOS transistor 207, the control electrode of NMOS transistor 208 and the control electrode of NMOS transistor 206. The second current electrode of PMOS transistor 204 is coupled to a first current electrode of NMOS transistor 205 and to the control electrode of PMOS transistor 203. A power supply terminal having an external power supply voltage signal (EVSS) 209 is coupled to the second current electrode of NMOS transistor 205, the second current electrode of NMOS transistor 206, and the second current electrode of NMOS transistor 208. In one embodiment, EVSS 209 is a ground potential as shown in FIG. 4. The second current electrode of PMOS transistor 207 and the second current electrode of NMOS transistor 208 are coupled to P-portion 117 and N-portion 115 of FIG. 3.

If EVDD 127 and IVDD 124 are powered up, the output of contention detection circuit 112 is high and the contention tri-state control signal 134 is inactive or disabled. Thus, the tri-stateable output buffer 118 is not forced into a tri-state condition when the contention tri-state control signal 134 is high. However, if EVDD 127 is generated in response to input/output pad 122 being powered up by other device(s) 131 and IVDD 124 and EVDD 126 are powered down, then the output of contention detection circuit 112 is low and the contention tri-state control signal 134 is active or enabled. Thus, the tri-stateable output buffer 118 is forced into a tri-state condition when the contention tri-state control signal 134 is low.

More specifically, when EVDD 127 is powered up, NMOS transistor 202 is turned on. If IVDD 124 is powered down, then the gate input to NMOS transistor 205 is low, PMOS transistor 204 is turned on which in turn causes NMOS transistor 208 to turn on and pull contention tri-state control signal 134 low.

However, if EVDD 127 is powered up and IVDD 124 is powered up, the input of NMOS transistor 202 is high, the gate input to NMOS transistor 205 is high which in turn causes PMOS transistor 207 to turn on and pull contention tri-state control signal 134 high. It should be appreciated that under these conditions there is no DC current flow between IVDD 124 and EVDD 127, and between IVDD 124 and EVSS 209. In addition, there is no DC current flow between EVDD 127 and EVSS 209. Therefore, integrated circuits fabricated with contention detection circuit 112 can be used in products that require low power consumption or IDDQ measurements for improved quality and reliability.

Figure 5:
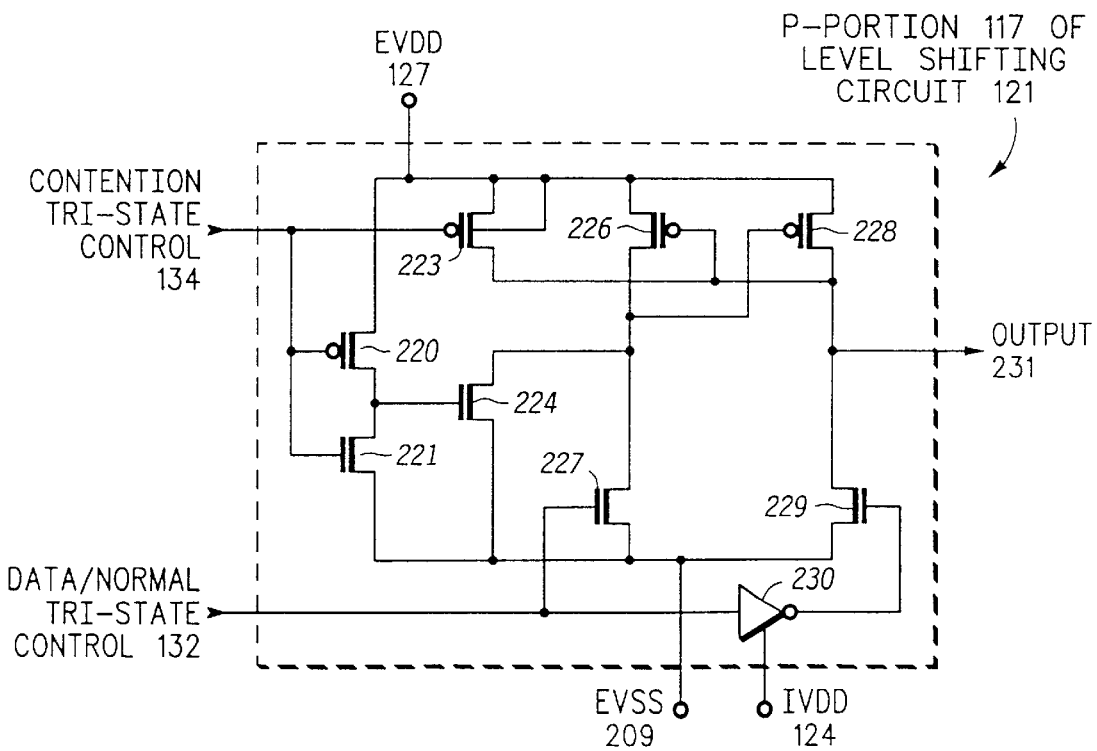
FIG. 5 illustrates, in schematic diagram form, a p-portion 117 of level shifting circuit 121 of FIG. 3 in accordance with an alternate embodiment of the present invention.

Shown in FIG. 5 is a schematic diagram of P-portion 117 of level shifting circuit 121 in accordance with one embodiment of the present invention. P-portion 117 comprises a PMOS transistor 220, a NMOS transistor 221, a PMOS transistor 223, an NMOS transistor 224, an NMOS transistor 227, a PMOS transistor 226, a PMOS transistor 228, an NMOS transistor 229, and an inverter 230.

The control electrode of PMOS transistor 223, the control electrode of PMOS transistor 220, and the control electrode of NMOS transistor 221 are coupled to contention tri-state control signal 134 of FIG. 4. The control electrode of N channel transistor 227 and the input of inverter 230 are coupled to data/normal tri-state control signal 132. The output of inverter 230 is coupled to the control electrode of NMOS transistor 229. Inverter 230 is coupled to IVDD 124. EVSS 209 is coupled to a first current electrode of NMOS transistor 229, a first current electrode of NMOS transistor 227, a first current electrode of NMOS transistor 224, and a first current electrode of NMOS transistor 221. A second current electrode of NMOS transistor 221 is coupled to the control electrode of NMOS transistor 224 and a first current electrode of PMOS transistor 220. EVDD 127 is coupled to the second current electrode of PMOS transistor 220, a first current electrode of PMOS transistor 223, the well region of PMOS transistor 223, a first current electrode of PMOS transistor 226, and a first current electrode of PMOS transistor 228. Output 231 is coupled to the second current electrode of NMOS transistor 229, the second current electrode of PMOS transistor 228, the second current electrode of PMOS transistor 223, and the control electrode of PMOS transistor 226. The gate electrode of PMOS transistor 228 is coupled to a second current electrode of NMOS transistor 227, the second current electrode of PMOS transistor 226, and the second current electrode of NMOS transistor 224.

Contention tri-state control signal 134 and data/normal tri-state control signal 132 are low when IVDD 124 is powered down and EVDD 127 is generated in response to input/output pad 122 being powered up by other device(s) 131. Under these conditions PMOS transistor 223 and NMOS transistor 224 are turned on. This forces output 231 high which in turn turns off the P-side 111 of tri-stateable output buffer 118. More specifically, under these conditions PMOS transistor 223 pulls the gate of PMOS transistor 226 high because NMOS transistor 229 is turned off. In addition, since NMOS transistor 224 is also turned on it pulls the gate of PMOS transistor 228 low, which further pulls the gate of PMOS transistor 226 high to ensure that output 231 is high so that the P-side 111 of tri-stateable output buffer 118 is turned off. At the same time, N-portion 115 turns off the N-side 113 of tri-stateable output buffer 118 in a similar manner. It should be appreciated that a circuit similar to that shown in FIG. 5 may be used for N-portion 115. It should be also appreciated that buffer circuitry 116 may be forced into a tri-state condition using other means.

During normal operation, however, contention tri-state control signal 134 is high and that turns off PMOS transistor 223 and NMOS transistor 224 so that P-portion 117 does not have a DC current load during normal operation. Therefore, integrated circuits fabricated with P-portion 117 can be used in products requiring low power consumption.

The foregoing description and illustrations contained herein demonstrate many of the advantages associated with the present invention. In particular, an integrated circuit for handling buffer contention and a method for handling buffer contention have been disclosed.

Thus it is apparent that there has been provided, in accordance with the invention, an integrated circuit and a method for handling buffer contention that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. An integrated circuit having a powered-off state and a powered-on state, the integrated circuit powered in the powered-on state by a first power supply voltage, the integrated circuit comprising:
    a first terminal to receive the first power supply voltage;
    a second terminal to couple to an external device, the external device providing a second power supply voltage;
    a tri-stateable output buffer coupled to the first and second terminals; and
    a contention detection circuit coupled to the tri-stateable output buffer, the contention detection circuit to place the tri-stateable output buffer in a tri-stated condition when the second power supply voltage is present at the second terminal and the first power supply voltage is absent from the first terminal, thereby minimizing undesired buffer contention.

2. An integrated circuit according to claim 1 wherein the second power supply voltage powers the tri-stateable output buffer and the contention detection circuit when the second power supply voltage is present at the second terminal and the first power supply voltage is absent from the first terminal.

3. An integrated circuit according to claim 1 wherein the contention detection circuit does not place the tri-stateable output buffer in a tri-stated condition when the first power supply voltage is present at the first terminal.

* * * * *